United States Patent
Uda et al.

(10) Patent No.: US 11,148,978 B2
(45) Date of Patent: Oct. 19, 2021

(54) METHOD FOR PRODUCING SILICON-CARBIDE-BASED COMPOSITE

(71) Applicant: IHI AEROSPACE CO., LTD., Tokyo (JP)

(72) Inventors: Michimasa Uda, Tokyo (JP); Hiroshi Yamauchi, Tokyo (JP); Haruhiko Soeda, Tokyo (JP)

(73) Assignee: IHI AEROSPACE CO., LTD., Tokyo (JP)

( * ) Notice: Subject to any disclaimer, the term of this patent is extended or adjusted under 35 U.S.C. 154(b) by 0 days.

(21) Appl. No.: 16/493,859

(22) PCT Filed: Feb. 23, 2018

(86) PCT No.: PCT/JP2018/006701
§ 371 (c)(1),
(2) Date: Sep. 13, 2019

(87) PCT Pub. No.: WO2018/168400
PCT Pub. Date: Sep. 20, 2018

(65) Prior Publication Data
US 2020/0031722 A1   Jan. 30, 2020

(30) Foreign Application Priority Data

Mar. 14, 2017   (JP) .............................. JP2017-049031

(51) Int. Cl.
*C04B 35/80*   (2006.01)
*C04B 35/571*   (2006.01)

(52) U.S. Cl.
CPC ............ *C04B 35/571* (2013.01); *C04B 35/80* (2013.01)

(58) Field of Classification Search
CPC . C04B 35/571; C04B 35/80; C04B 2235/614; C04B 2235/493;
(Continued)

(56) References Cited

U.S. PATENT DOCUMENTS

2010/0272923 A1   10/2010   Fillion

FOREIGN PATENT DOCUMENTS

| CN | 102795871 A | 11/2012 |
|----|-------------|---------|
| JP | 2010-255174 A | 11/2010 |

OTHER PUBLICATIONS

David et al. New Textile Structures and Film-Boiling Densification for SiC/SiC Components. EPJ Web of Conferences 51,01004 (2013).*
(Continued)

*Primary Examiner* — Noah S Wiese
(74) *Attorney, Agent, or Firm* — Sughrue Mion, PLLC

(57) ABSTRACT

A method for producing a silicon-carbide-based composite. In the production of a silicon-carbide-based composite comprising a carbon-fiber-reinforced/silicon carbide composite (a C/SiC composite) or a silicon-carbide-fiber-reinforced/silicon carbide composite (a SiC/SiC composite), a film boiling method is carried out, using an organosilicon polymer having a chlorine-free polysilane skeleton and/or a chlorine-free polycarbosilane skeleton. The organosilicon polymer is in a liquid form at room temperature. The molar ratio of Si and C in the matrix of the C/SiC composite or the SiC/SiC composite is Si:C=1:1.08 to 1:1.43.

4 Claims, 12 Drawing Sheets

Mechanism of thermal decomposition of PDMS and conversion into PCS

(58) Field of Classification Search
CPC .... C04B 2235/5244; C04B 2235/5248; C23C 16/325
See application file for complete search history.

(56) References Cited

OTHER PUBLICATIONS

David et al. Rapid Densification of Carbon and Ceramic Matrix Composites Materials by Film Boiling Process. 16th International Conference on Composite Materials. 2007.*
Patrick David et al., "New Textile Structures and Film-Boiling Densification for SiC/SiC Components", EPJ Web of Conferences, 2013, vol. 51, No. 01004.
Min Mei et al., "Characterizations of liquid polycabosilane (LPCS) used as SiC matrix precursor for CLVD process", Advanced Materials Research, 2013, pp. 195-199, vol. 750-752.
International Search Report for PCT/JP2018/006701, dated Apr. 24, 2018.
"Starfire® CVD 4000", Technical Data Sheet, Polymer-To-Ceramic Technology, Starfire Systems, Mar. 2018, XP055747791, URL:https://www.starfiresystems.com/wp-content/uploads/2018/03/CVD-4000.pdf, (2 pages total).
Extended European Search Report (EESR) dated Nov. 17, 2020, from the European Patent Office in European application No. 18768262.0.

* cited by examiner

Molecular weight distribution of LPS

Infrared absorption spectrum of LPS

29-Si-NMR analysis spectrum of LPS

SIMS analysis of SiC by MTS-CVI method – secondary ion image

Film boiling curve schematic figure

Process flow of FB trial production

External view of FB processing trial production configuration

FB treatment trial production   Change of density

SiC matrix generated by FB treatment

METHOD FOR PRODUCING SILICON-CARBIDE-BASED COMPOSITE

CROSS REFERENCE TO RELATED APPLICATIONS

This application is a National Stage of International Application No. PCT/JP2018/006701 filed Feb. 23, 2018, claiming priority based on Japanese Patent Application No. 2017-049031 filed Mar. 14, 2017.

TECHNICAL FIELD

The present invention relates to a method for producing a silicon-carbide-based composite, and more particularly relates to a method for producing a silicon-carbide-based composite that is capable of producing a silicon carbide composite cleanly and with high production efficiency.

BACKGROUND ART

Conventionally, a silicon-carbide-based composite, such as a carbon-fiber-reinforced/silicon carbide composite (a C/SiC composite) or a silicon-carbide-fiber-reinforced/silicon carbide composite (a SiC/SiC composite) or the like has been typically produced by manufacturing a preform having the desired shape from carbon fiber or from silicon carbide fiber, followed by producing a matrix layer of silicon carbide with a CVI method (Chemical Vapor Infiltration), a PIP method (Polymer Infiltration and Pyrolysis), a MI method (Melt Infiltration), or a film boiling method (Film Boiling) on the preform, and impregnating this preform with this matrix layer.

As such a CVI method, a method of forming a SiC matrix layer by thermal decomposition of methyltrichlorosilane ($CH_3Cl_3Si$:MTS), which is a raw material gas (for example, refer to Patent Document 1) is known. Since vapor-phase impregnation (deposition) is carried out, SiC can be infiltrated between the fibers of the preform for forming.

Moreover, it is also known that a SiC/SiC composite can be manufactured by a FB method (a film boiling method) by using MTS as starting material, and this is considered to be excellent from the point of view of cost.

Furthermore, SMP-10 (product name, manufactured by the Starfire company), CVD-742 (product name, manufactured by the Starfire company), CVD-4000 (product name, manufactured by the Starfire company), and VD-2000 (product name, manufactured by the Starfire company) are also known as liquid precursors for SiC ceramics.

PRIOR ART DOCUMENTS

Patent Document

Patent Document 1: JP2010-255174A

SUMMARY OF INVENTION

Technical Problem

However, with the CVI method described above that employs MTS, there has been the problem that the formation of the SiC matrix layer takes a long time, because the growth rate of the SiC is low. Moreover, since MTS contains chlorine so that the reaction exhaust gas contains hydrogen chloride (HCl), accordingly the equipment can easily deteriorate due to corrosion, and, in order to avoid this, frequent neutralization processing becomes necessary and exhaust gas treatment equipment is required, so that there have been the problems of increased operational cost and increased equipment cost.

On the other hand, with a FB method employing MTS, hydrochloric acid gas is generated from the MTS raw material during the film boiling process and remains in the processing liquid, so that it becomes necessary to renew the processing liquid frequently, which entails high cost. Furthermore this method has been only implemented at the research level by France CEA, P. DAVID et al., and it is considered that industrial application would be difficult.

Yet further, with a method that uses SMP-10, SMP-10 itself is comparatively high in price (several hundreds of thousands of yen per kg), and, since SMP-10 has a double bond in its molecular structure and polymerizes at a comparatively low temperature, it is not suitable for the FB method, although it can be used for the PIP method.

Even further, although the PIP method can form a SiC matrix in a comparatively convenient manner, it is inferior in performance, and the time required for production becomes long and the cost becomes high because repeated processing is necessary.

Moreover, with the MI method, the time required for production is short and the manufacturing process is convenient, but it is difficult to suppress the reaction between metal Si and the carbon fibers, silicon carbide fibers. In order to maintain fiber strength, it is necessary to carry out high cost CVI processing in advance.

The present invention has been made in consideration of problems of this type with the prior art, and its objective is to provide a method for producing a silicon-carbide-based composite that can manufacture a silicon carbide composite cleanly and with good production efficiency.

Solution to Problem

As a result of diligent studies aimed at achieving the objective described above, the present inventors have found that the objective described above can be attained by implementing a film boiling method employing a predetermined organosilicon polymer, and have thereby completed the present invention.

That is, the method for producing a silicon-carbide-based composite of the present invention is such that in the production of a silicon-carbide-based composite comprising a carbon-fiber-reinforced/silicon carbide composite (a C/SiC composite) or a silicon-carbide-fiber-reinforced/silicon carbide composite (a SiC/SiC composite), a film boiling method is carried out using an organosilicon polymer having a chlorine-free polysilane skeleton and/or a chlorine-free polycarbosilane skeleton.

In a preferred embodiment of the method for producing a silicon-carbide-based composite of the present invention, the organosilicon polymer is in a liquid form at room temperature.

Furthermore, in another embodiment of the method for producing a silicon-carbide-based composite of the present invention, the composition ratio (molar ratio) of Si and C in the matrix of the C/SiC composite or the SiC/SiC composite is Si:C=1:1.08 to 1:1.43.

Advantageous Effects of Invention

According to the present invention, since the film boiling method is carried out, using a predetermined organosilicon polymer, accordingly it is possible to provide a method for producing a silicon-carbide-based composite that is capable of producing a silicon carbide composite cleanly and with good manufacturing efficiency.

For example, when LPS (liquid polysilanes) is applied to the FB method, since hydrochloric acid gas does not remain in the processing solution, and, apart from LPS, only hydrogen gas is generated, accordingly continuous FB treatment becomes possible, and adaptation to mass production becomes possible.

Furthermore, due to the development of the FB method employing LPS (a LPS-FB method), it becomes possible to form a SiC matrix at lower cost and higher efficiency than in the case of the PIP method and the MI method, which are prior art methods.

It should be understood that when LPS is applied to the FB method, as in the case of the present invention, the Si:C ratio (the molar ratio) of the SiC matrix that is formed becomes around 1:1.43, so that the C (carbon) amount is higher than the Si:C ratio of 1:1 (stoichiometric ratio) of SiC that is formed by employing MTS. As a result, the oxidization resistance at high temperature may be reduced.

On the other hand, it is possible to reduce this excessive amount of C by decarbonization processing; for example, it is possible to reduce the Si:C ratio to 1:1.08 by decarbonization processing.

DESCRIPTION OF EMBODIMENTS

The method of the present invention for producing a silicon-carbide-based composite will now be explained. As described above, the method of the present invention for producing a silicon-carbide-based composite is a method for producing a C/SiC composite or a SiC/SiC composite, and involves carrying out a FB method using an organosilicon polymer (LPS) having a chlorine-free polysilane skeleton, and/or a chlorine-free polycarbosilane skeleton.

LPS

Here, a typical example of LPS that may be cited is polydimethyl silane (PDMS), which is a polymer in which around 50 units of $—SiMe_2-$(Me: $—CH_3$) are linked.

Figure 1:
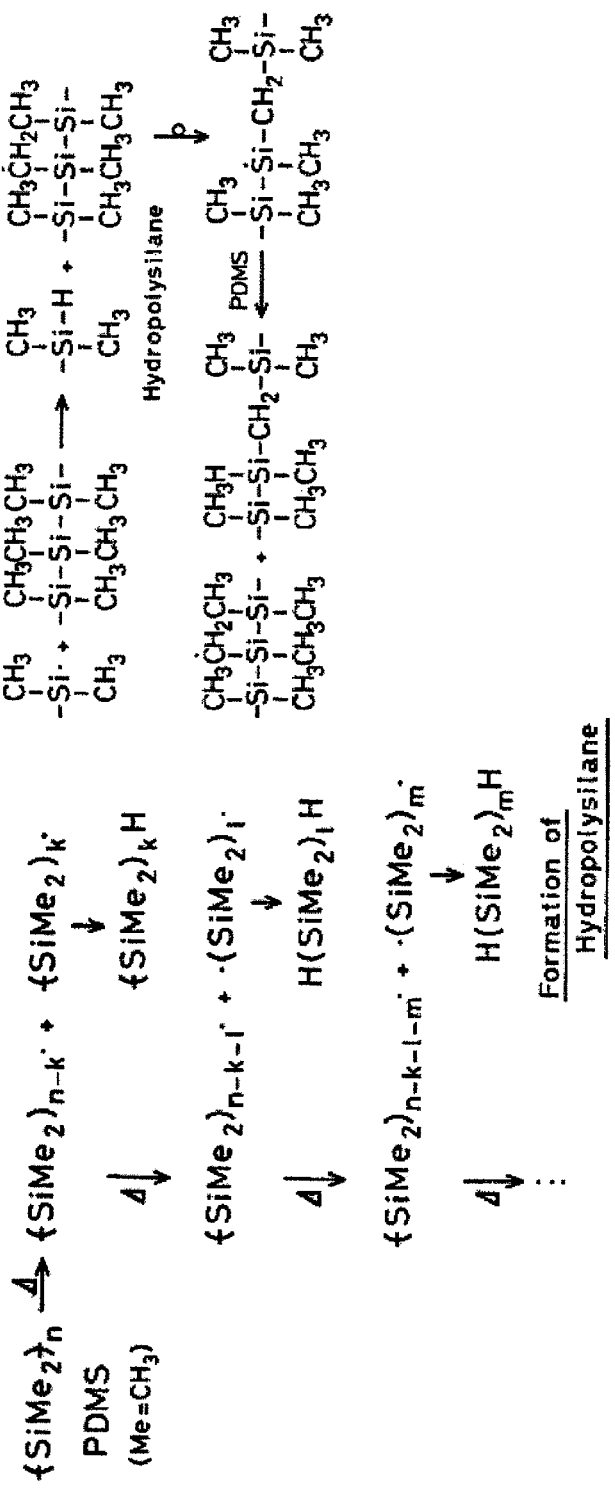
FIG. 1 is an explanatory figure showing a mechanism of thermal decomposition of PDMS and conversion into PCS.

When such a polymer is heated, as shown in the equation on the left side of FIG. 1, the chains are broken one after another (breakage of Si—Si bonds), and the material thermally decomposes into polysilanes of low molecular weight. Since, from the result of analysis, the average molecular weight is considered to be about 400, accordingly the material is around m=5 to 6 in the formula of FIG. 1. Because of this low molecular weight, the material is liquid at room temperature. Therefore these polymers are appropriately termed LPS (liquid polysilanes). Si—H bonds are formed at the terminals of this polymer, probably by hydrogen being extracted from methyl groups in other polysilanes. Polysilanes with the above or lower molecular weight have higher vapor pressure, and volatilize out of the reaction system as gas. LPS is a low molecular weight substance generated by this decomposition, and is immediately separated from the system by distillation.

The structural formula can be expressed as $H(SiMe_2)_{5-6}H$ (where Me represents a methyl group), but this is not precise because there is a distribution of molecular weights.

(1) Molecular Weight Distribution

Figure 2:
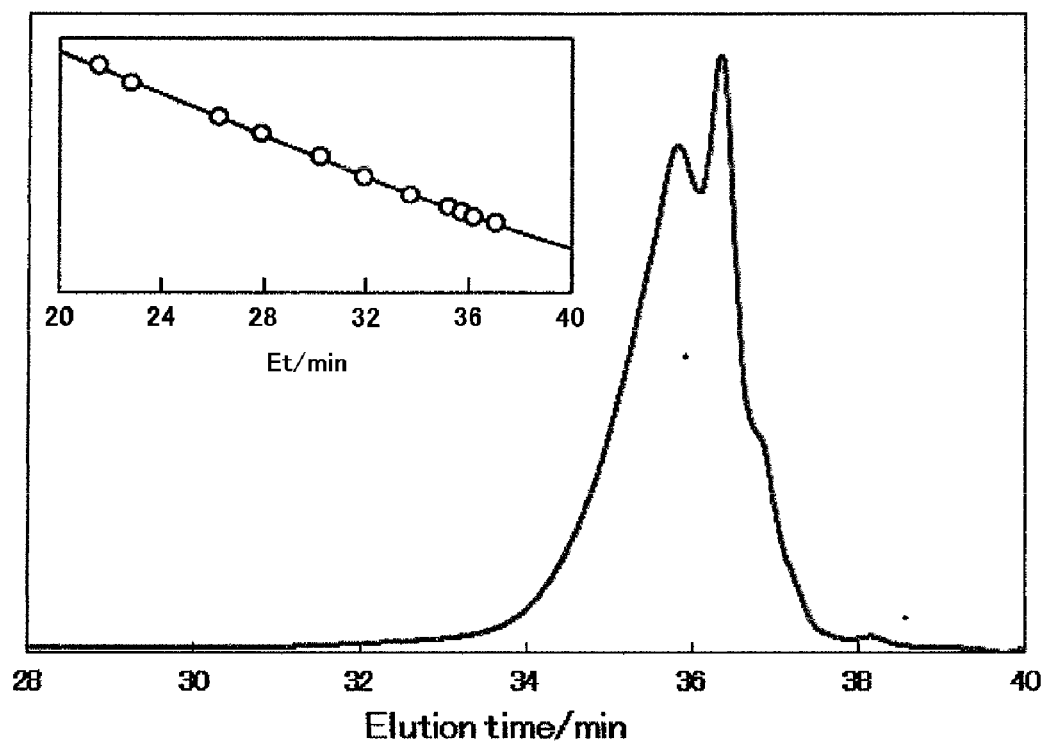
FIG. 2 is a characteristic figure showing the molecular weight distribution of LPS.

FIG. 2 shows the molecular weight distribution of LPS. The average molecular weight is estimated to be about 400 in polystyrene equivalent. The molecular weight is in the range of 133-3437.

(2) Infrared Absorption Spectrum

Figure 3:
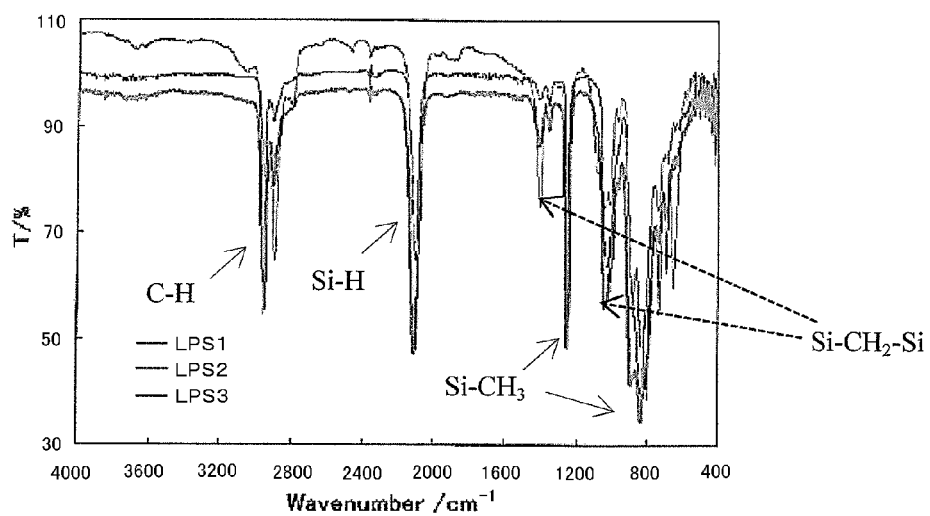
FIG. 3 is a characteristic figure showing the infrared absorption spectrum of LPS.

FIG. 3 shows the infrared absorption spectrum of LPS. It will be understood that LPS is an organosilicon polymer having the structure shown in FIG. 3.

(3) 29-Si-NMR

Figure 4:
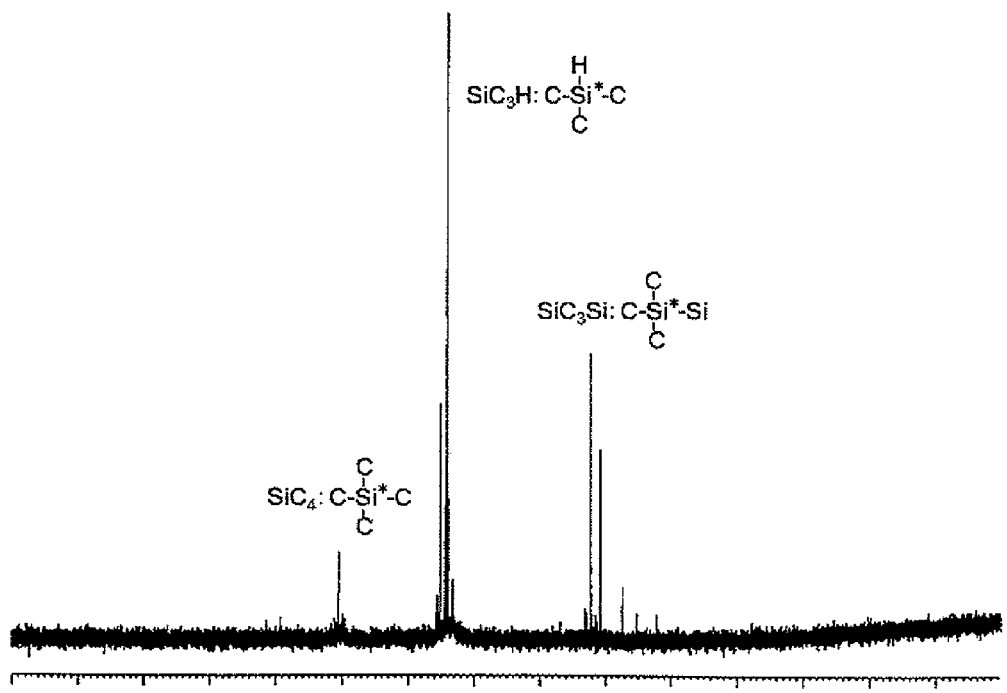
FIG. 4 is a characteristic figure showing the 29-Si-NMR analysis spectrum of LPS.

The results of molecular structure analysis of LPS by 29-Si-NMR are shown in FIG. 4. From the results of infrared spectral analysis and 29-Si-NMR analysis, it is estimated that the molecule is composed of around 7 Si atoms according to 29-Si-NMR, and the ratio of structural units is speculated as around $SiC_4:SiC_3H:SiC_3Si=1:3.31:1.08$. This is not inconsistent with other analysis results such as FT-IR.

SIMS Analysis of SiC by the MTS-CVI Method

Whether or not chlorine (Cl) remains in a SiC matrix that has been formed by employing MTS (methyltrichlorosilane) as raw material can be checked by SIMS analysis.

Figure 5:
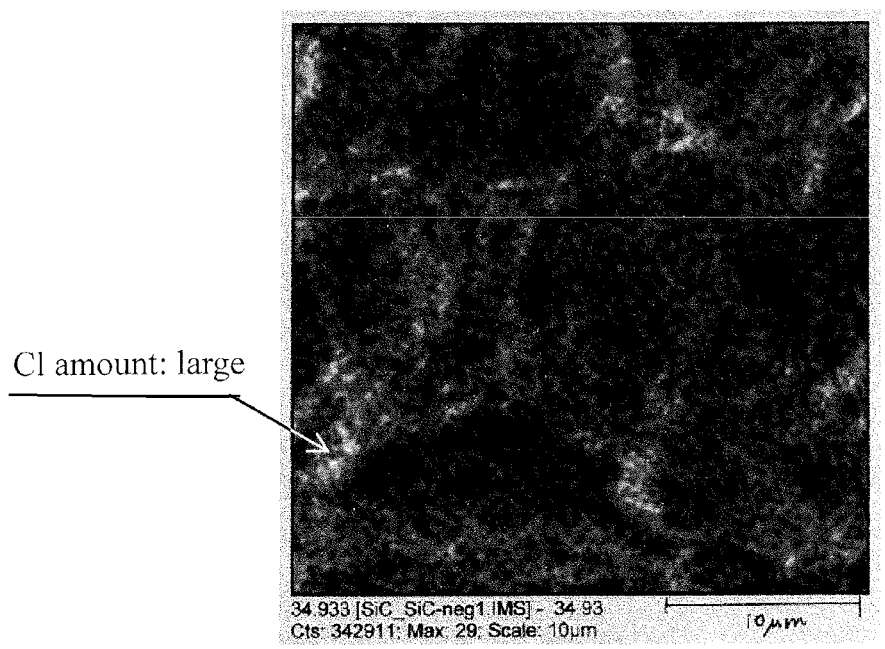
FIG. 5 is a figure showing an SIMS analysis image of SiC.

The results of SIMS analysis are shown in FIG. 5. Cl was detected by SIMS analysis, as shown in FIG. 5. Accordingly it will be understood that some Cl remains within the SiC matrix when MTS is employed as the raw material. Accordingly, since Cl remains when MTS is used as the raw material, it is possible to distinguish the resulting product from a SiC matrix that is formed by employing LPS as the raw material.

Furthermore since, as described above, it is difficult to apply SMP-10 to the FB method, accordingly it is clear that LPS is appropriate as a raw material for a SiC matrix to be formed around carbon fibers or silicon carbide fibers.

It should be understood that CVD-742, CVD-4000, and CVD-2000 are treatment agents having polycarbosilane skeletons that are applicable to the FB method.

Film Boiling (FB) Treatment

Film boiling (FB) is a phenomenon that is treated as a heat transfer problem in the chemical engineering field.

Figure 6:
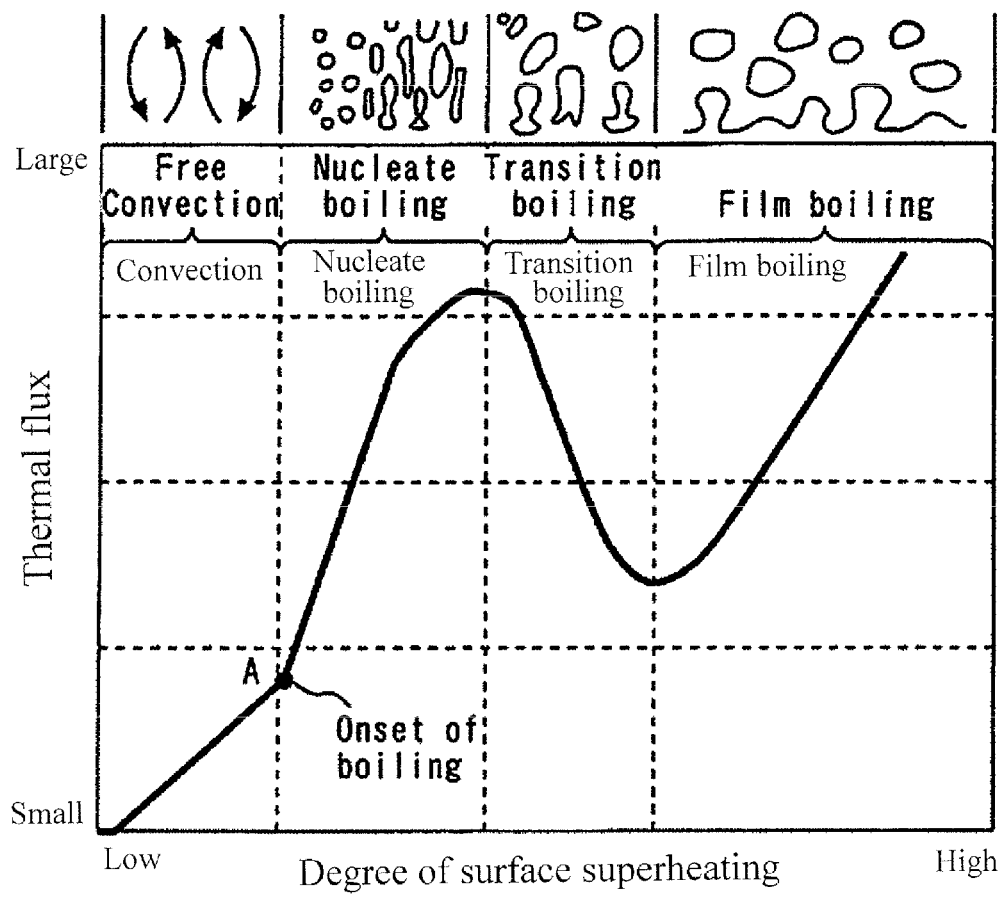
FIG. 6 is a schematic figure showing a film boiling curve.

FIG. 6 is a schematic figure showing a film boiling curve that expresses change of the film boiling phenomenon due to heat transfer at the solid-liquid interface as a relationship between the thermal flux (the heat transfer amount per unit area from the solid phase to the liquid phase) and the degree of surface superheating (the temperature difference at the solid phase/liquid phase interface).

When the solid phase that is in contact with the liquid phase is superheated, convection, and then nucleate boiling take place, and, as the amount of the degree of surface superheating increases, the thermal flux also increases. Normally, the boiling point of the liquid phase corresponds to the latter half of the nucleate boiling region. If the solid phase temperature is raised further, then a vapor film is formed, and the thermal flux rather decreases, so that it becomes difficult to keep both the solid phase temperature and the liquid phase temperature constant (transition boiling). Thereafter, the system transitions again to the film boiling region in which the thermal flux increases along with further increase of the degree of surface superheating.

When the film boiling phenomenon is utilized in the C/C conversion process, the interface between the carbon fiber and the liquid phase (treatment solution: a hydrocarbon based solvent, such as cyclohexane) is covered uniformly by a boiling vapor film, and a carbon matrix is precipitated due to thermal decomposition of this high density vapor. Since a high density vapor film is continuously created in the liquid, accordingly the densification proceeds at high speed.

From the 1990s, research of the FB method has been conducted by P. David et al. at the CEA Royal Institute in France.

The following findings have been obtained as features of the FB method.
(1) The densification proceeds quickly, and the processing time is around 1/50 of the time in the case of the CVI method.
(2) The amount of raw material used can be reduced to around 1/10 of the amount in the case of the CVI method.
(3) The bonding between the fiber and the matrix is strong.
(4) The carbon matrix that is obtained has the same quality as a CVI carbon matrix.
(5) The higher the temperature is and the higher the pressure is, the greater is the rate of matrix generation.
(6) The matrix generation rate is higher for solvents with high carbon content and low dissociation energy.

Decarbonization Processing

First of all, in order to know how far the decarbonization process has progressed, it is necessary accurately to comprehend the remaining amount of the C component. In general, it may be said that it is possible to comprehend the amount of a component by EPMA analysis, but it is difficult to accurately comprehend the amount of the C component with this method.

Thus, with the present invention, the contents of carbon (C), hydrogen (H), oxygen (O), and silicon (Si) are analyzed by the method shown in Table 1.

Since, with this method, the material to be analyzed needs to be powdered, accordingly the SiC matrix formed by the FB method cannot be employed as the test sample for analysis. Accordingly, LPS which is used as a raw material is converted to PCS having an ultra high molecular weight (polycarbosilanization) by a liquid phase-gas phase thermal decomposition method, and is further calcined and converted to a SiC ceramic, which is used as the analysis test sample.

Since the decarbonization process is carried out via a process in which the PCS (an organic ceramic polymer) is converted into a SiC ceramic, accordingly the decarbonization behavior may be confirmed by altering the firing conditions in a conversion process to ceramics.

PCS, which is obtained by keeping it at 475° C. for 20 hours, is mainly used. Calcination in a hydrogen atmosphere can be carried out, using a tubular oven, by superheating the material up to a predetermined temperature at 200° C./hour in 40 volume percent $H_2$/Ar (250 ml/min), and holding it for one hour. The holding temperature may, for example, be 1000° C., 1500° C., or 1600° C.

TABLE 1

Analytical means of decarbonated SiC matrix

| Analytical Method | Subject of investigation | Device name |
|---|---|---|
| Elementary Analysis | C, H, O, Si amount analysis | C: SC-144DR (Manufacturer: Leco) O, H: EMGA-930 (Manufacturer: HORIBA) Si: Decomposition with molten salt decomposition method using sodium carbonate, followed by ICP emission spectroanalysis by using ULTIMA2 (Manufacturer: HORIBA) |
| FT-IR (KBr tablet method) | Investigation of chemical structure | FT/IR-4100 (Manufacturer: Jasco) |
| XRD | Investigation of SiC crystallization | MiniFlex (Manufacturer: Rigaku) |

Examples of the results of elemental analysis under decarbonization process conditions is shown in Table 2. Only the amount of Si in the molten salt decomposition method has been considered to be unreliable. Therefore, the amount of Si has been obtained by subtracting the total of the other analysis values from 100%, and thus obtained amount has been considered reliable.

TABLE 2

C/Si molar ratio depending on calcination condition - measurement results

| | Calcination condition | | Element ratio | | | | C/Si Molar ratio |
|---|---|---|---|---|---|---|---|
| Class | Temperature ° C. | Atmosphere | Si | C | H | O | |
| $PCS_{LPS}$ | 1000 | $N_2$ | 60.05 | 36.89 | 1.12 | 1.94 | 1.43 |
| | 1000 | 40 Vol % | 65.19 | 31.24 | 0.74 | 1.78 | 1.12 |
| | 1500 | $H_2$/Ar | 67.59 | 31.41 | 0.16 | 1.83 | 1.08 |

From these results, it will be understood that, in the present invention, the SiC matrix obtained from LPS, when decarbonized, has a Si/C ratio of around Si:C=1:1.08 to 1.43.

EXAMPLES

In the following the present invention will be explained in more detail with reference to examples thereof, but the present invention is not limited to those examples.

Example 1

Figure 7:
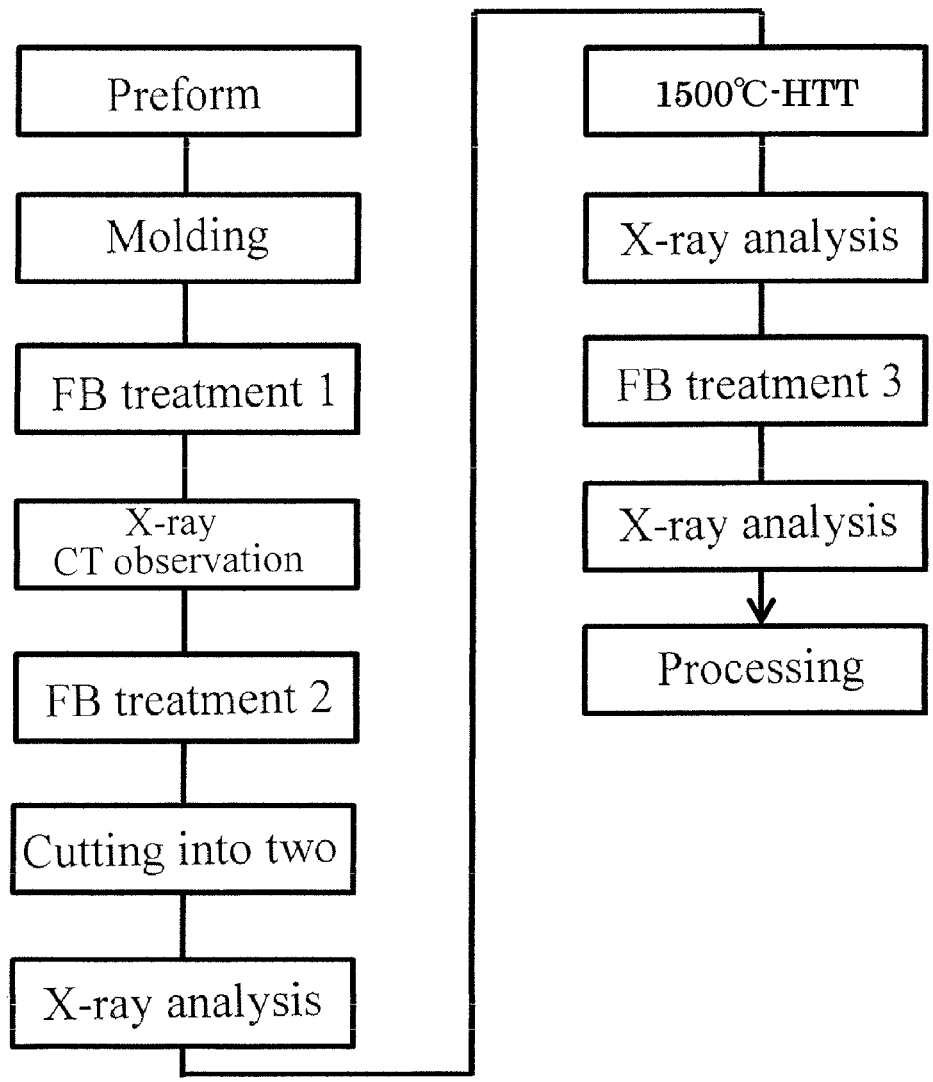
FIG. 7 is a process figure showing a processing flow for producing a C/SiC composite.

A disk-shaped C/SiC composite was manufactured according to the process flow shown in FIG. 7.

In detail, first, a disk shaped preform was made by employing a felt manufactured by Japan Vilene. Co. At this time, this felt consisted of 90 mass % of carbon fiber and 10 mass % of acrylic fiber with a PAN type carbon fiber (HTA) base and Vf is around 10%. Next, molding was performed. This molding was performed by tightening up a bolt until the Vf became 30%, thereby obtaining a molded disk-shaped body with a central hole, having molded dimensions of φ100 (outer diameter), φ30 (hole diameter)×25t (thickness).

Figure 8:
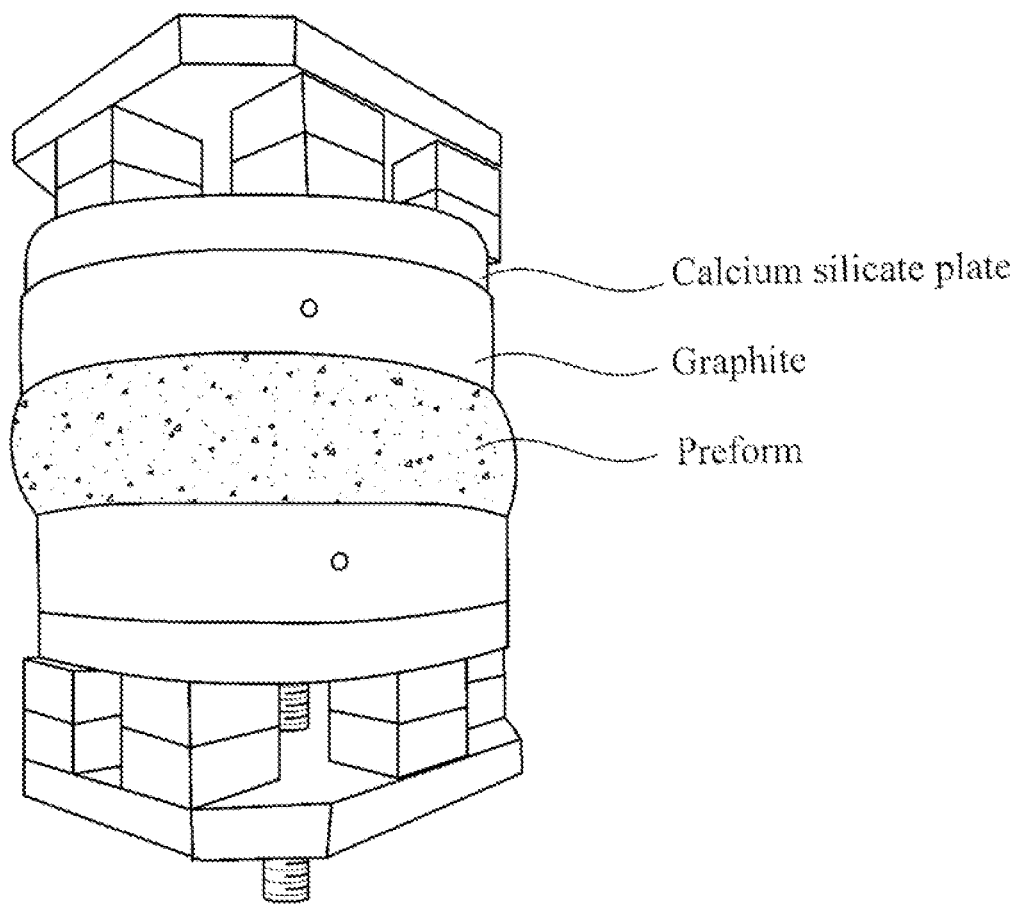
FIG. 8 is an external view showing an example of a FB treatment device.

Next, the FB treatment device shown in FIG. 8 was constructed by employing this molded body that had been obtained, and FB treatment 1 was carried out. At this time, a body to be processed was formed by sandwiching the molded body described above between a graphite plate and a calcium silicate plate, and this was dipped into an LPS solution and the graphite plate was heated by induction heating. This heating process was carried out by holding for 6 hours at 1200° C. twice. The molded body after this processing was observed with microfocus X-ray CT. From the X-ray CT image, it has been understood that the overall density is low, but is homogeneous.

Next, FB treatment 2 was carried out. At this time, the graphite plate was removed from the body to be processed described above. The body to be processed was dipped into LPS, and heat application was made (preform direct heating). This heating process was carried out by holding for 4 hours at 1200° C. twice.

Next, the cut body obtained as described above was subjected to HTT treatment for one hour at 1500° C. in an argon atmosphere by employing a small graphitization furnace. In this HTT treatment, the temperature was raised to 1200° C. at 600° C. per hour and from 1200° C. to 1500° C. in 2.5 hours, and then the body was maintained at 1500° C. for one hour. The HTT treated body was subjected to X-ray diffraction analysis (diffraction angle 20°~50°). It has been found that the SiC conversion progressed considerably due to this HTT treatment at 1500° C. The changes of density due to this series of processes are shown in FIG. 9.

Figure 9:
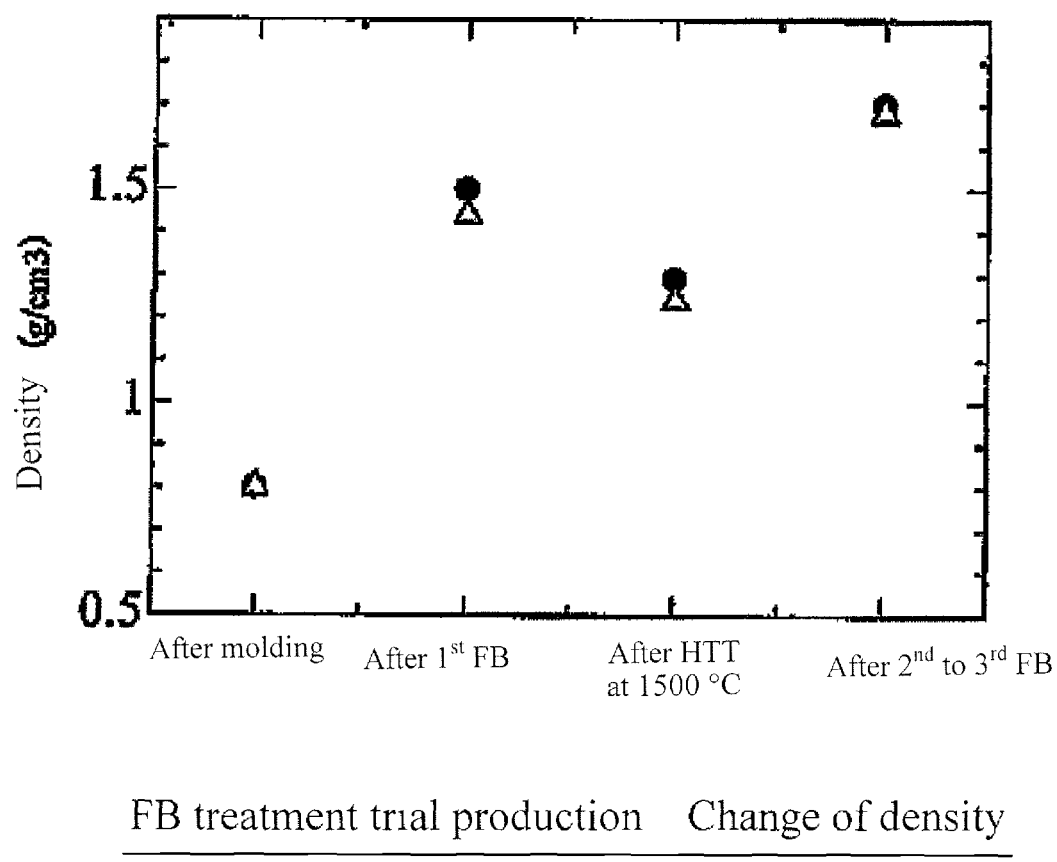
FIG. 9 is a characteristic figure showing density transitions of a composite.
Figure 10:
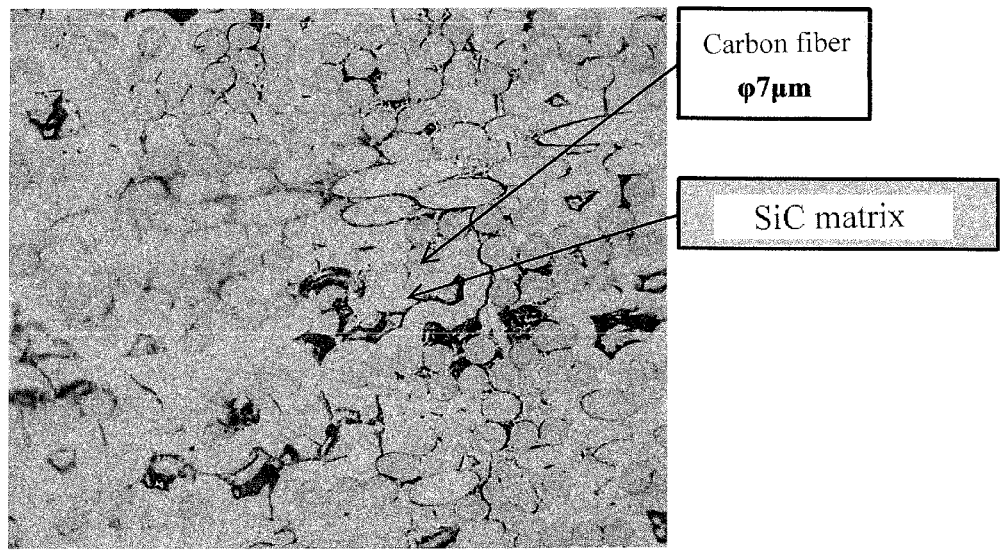
FIG. 10 is a microphotograph of a SiC matrix formed by FB treatment.

From FIG. 9 it will be understood that, after the final FB treatment, the density of the composite obtained changed to around 1.7 g/cm$^3$. At this time, at the diametrical center, the generation of a SiC matrix by the FB treatment was confirmed, as shown in FIG. 10.

Figure 11:
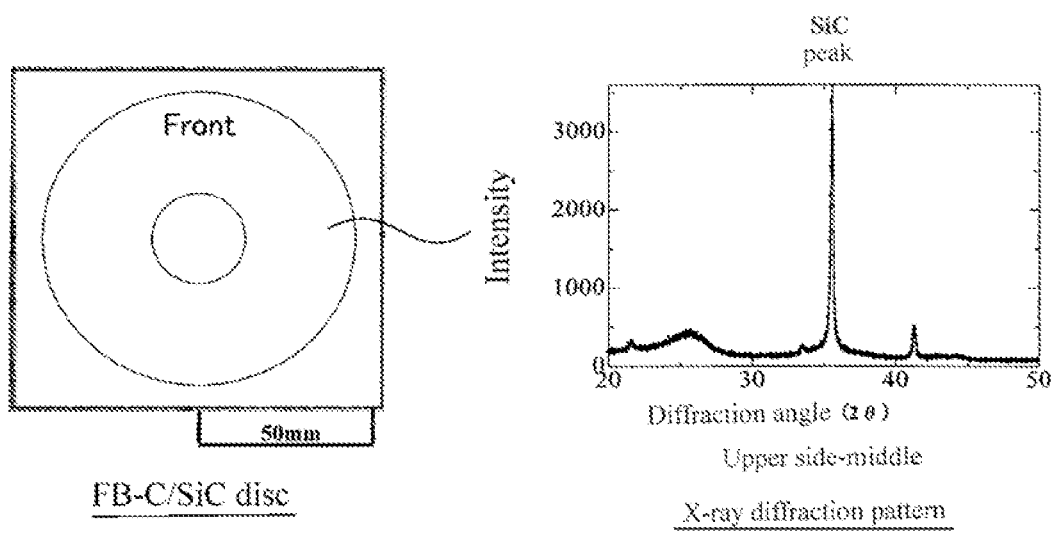
FIG. 11 is a picture showing an external view of a C/SiC disk formed by FB treatment, and a characteristic figure showing results of X-ray diffraction.
Figure 12:
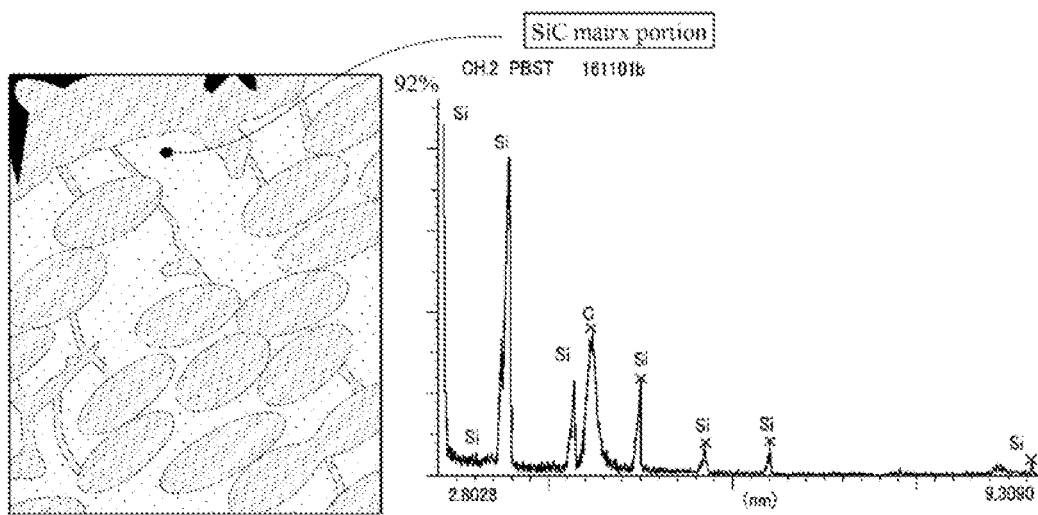
FIG. 12 is a microphotograph of a SiC matrix formed by FB treatment, and a characteristic figure showing EPMA analysis results.

Furthermore, according to the X-ray diffraction figure shown in FIG. 11, it was possible to confirm a high peak that indicates SiC bonding, and, according to the EPMA analysis shown in FIG. 12, it has also been found that the amount of C was excessive with respect to the stoichiometric ratio of SiC.

While the present invention has been explained with a few embodiments and Examples, the present invention is not limited to these embodiments and Examples, and various changes can be made within the gist of the present invention.

INDUSTRIAL APPLICABILITY

The present invention can be applied to liquid fuel rocket nozzles in the case of C/SiC and to turbine vanes for jet engines and generators and so on in the case of SiC/SiC, and thereby it is possible to obtain a compact and high density product with good manufacturing efficiency.

The invention claimed is:

1. A method for producing a silicon-carbide-based composite, wherein in the production of a silicon-carbide-based composite comprising a carbon-fiber-reinforced/silicon carbide composite (a C/SiC composite) or a silicon-carbide-fiber-reinforced/silicon carbide composite (a SiC/SiC composite), a film boiling method is carried out using an organosilicon polymer having a chlorine-free polysilane skeleton.

2. The method for producing a silicon-carbide-based composite according to claim 1, wherein the organosilicon polymer is in a liquid form at room temperature.

3. The method for producing a silicon-carbide-based composite according to claim 1, wherein a composition ratio (molar ratio) of Si and C in a matrix of the C/SiC composite or the SiC/SiC composite is Si:C=1:1.08 to 1:1.43.

4. The method for producing a silicon-carbide-based composite according to claim 2, wherein a composition ratio (molar ratio) of Si and C in a matrix of the C/SiC composite or the SiC/SiC composite is Si:C=1:1.08 to 1:1.43.

\* \* \* \* \*